(12) United States Patent
Lee

(10) Patent No.: US 7,491,648 B2
(45) Date of Patent: Feb. 17, 2009

(54) METHOD OF PATTERNING A PHOTORESIST FILM USING A LITHOGRAPHIC

(75) Inventor: Il Ho Lee, Seoul (KR)

(73) Assignee: Donbu Electronics Co., Ltd., Seoul (KR)

( * ) Notice: Subject to any disclaimer, the term of this patent is extended or adjusted under 35 U.S.C. 154(b) by 85 days.

(21) Appl. No.: 11/024,706

(22) Filed: Dec. 30, 2004

(65) Prior Publication Data
US 2005/0260860 A1 Nov. 24, 2005

(30) Foreign Application Priority Data
May 20, 2004 (KR) .................. 10-2004-0035850

(51) Int. Cl.
*H01L 21/302* (2006.01)
(52) U.S. Cl. .............. 438/706; 438/725; 430/5; 430/311
(58) Field of Classification Search .......... 438/706, 438/710, 712, 714, 725; 430/5, 311, 329
See application file for complete search history.

(56) References Cited
U.S. PATENT DOCUMENTS

| | | | | |
|---|---|---|---|---|
| 6,107,009 A * | 8/2000 | Tan | .......... | 430/331 |
| 6,174,806 B1 * | 1/2001 | Thakur et al. | .......... | 438/653 |
| 6,200,736 B1 * | 3/2001 | Tan | .......... | 430/319 |
| 6,613,500 B1 * | 9/2003 | Phan et al. | .......... | 430/394 |
| 2002/0187434 A1 * | 12/2002 | Blatchford et al. | .......... | 430/322 |
| 2004/0029026 A1 * | 2/2004 | Hayasaki et al. | .......... | 430/30 |
| 2005/0087217 A1 * | 4/2005 | Hayasaki et al. | .......... | 134/94.1 |

OTHER PUBLICATIONS

U.S. Appl. No. 11/024,706, filed Dec. 30, 2004, Lee.
U.S. Appl. No. 11/024,721, filed Dec. 30, 2004, Lee.

* cited by examiner

*Primary Examiner*—Kin-Chan Chen
(74) *Attorney, Agent, or Firm*—Lowe Hauptman Ham & Berner, LLP

(57) ABSTRACT

Method for patterning a photoresist film in lithographic process including the steps of: coating the photoresist film on a substrate provided with an under layer; exposing the substrate; firstly developing the photoresist film; exposing a whole surface of the substrate; and secondly developing the photoresist film. The present method has effects on improving an accuracy of formation of pattern and preventing from scum, photoresist residues, and so on, with relatively low cost and short process time.

8 Claims, 5 Drawing Sheets

METHOD OF PATTERNING A PHOTORESIST FILM USING A LITHOGRAPHIC

BACKGROUND OF THE INVENTION

1. Field of the Invention

The present invention relates to lithography technology, more particularly, to a method for patterning a photoresist film using a lithographic process.

2. Description of the Related Art

Due to the recent high growth of information and communication technologies, the technology of manufacturing semiconductor devices has rapidly developed. A semiconductor device has been developed toward higher integration, miniaturization, and higher operational speed. Also, the requirements on microlithography for improving a degree of integration has become severe.

Lithography technology is used to transfer patterns formed on a mask to a layer of radiation-sensitive material covering the surface of a substrate, and is a core technology used to provide a high degree of integration and minuteness in semiconductor devices. Generally, a lithographic process is carried out through a sequence of processes including a coating process of a photoresist film, a soft bake process, an alignment process, an exposure process, a post exposure bake (PEB) process, and a development process.

A photoresist has a photosensitivity to light, and has a resistance against the etching of underlying layers. Photoresist material is divided into a positive photoresist, and a negative photoresist. The positive photoresist, having a high resolution and superior resistance against etching, is widely used in a high integration semiconductor process, wherein reactions such as decomposition, scission of molecular chains, and so on, occur so that the solubility is greatly increased in a portion exposed to a light which is removed during the development process. By comparison, in the negative photoresist, a crosslinking reaction occurs so that the molecular weight is greatly increased in a portion exposed to light, and the exposed portion becomes insoluble in the development solution. After development, the unexposed portion is expunged.

A development process is the process in which a photoresist that was changed by exposure to light is removed so as to transfer a pattern of a mask into a substrate. It is generally used in a wet development process with an alkaline aqueous solution developer containing Tetra Methyl Ammonium Hydroxide (TMAH) as a main component.

There are several methods of development, such as a puddle method, a spray method, and a dipping method. In a puddle method, a photoresist film is developed in a state in which a substrate is has moved after applying a developer. In a spray method, a developer is continuously sprayed during a development process. The spray method is advantageous in successive processes, but the developer is extremely exhausted. A dipping method may not be available for successive processes.

In any one of these method of development, problems such as scum, and photoresist residues disturb the etching of an underlying layer during an etching process, and form a bridge between wiring lines which causes a short failure of a device.

FIG. 1 is a cross-sectional view illustrating scums and photoresist residues. The photoresist pattern is formed by developing a photoresist film 12, after aligning and exposing a photoresist film 12 coated on an underlying layer 11 of a semiconductor substrate 10. Scum 12a and photoresist residues 12b, due to incomplete removal of a photoresist film 12, are causes of failures in succeeding processes. Especially, in pad opening processes for opening metal pads to be bonded to external circuits, relatively thick photoresist film and low exposure energy are used so that failures frequently take place such as scum due to nonuniformity of the thickness of photoresist film and nonuniformity of the exposure energy.

In case an underlying layer 11 is formed of silicon oxynitride such as SiON, or silicon nitride such as $SiN_x$, a photo acid generator of the photoresist reacts with the silicon oxynitride or silicon nitride. As a result, a new resultant material is formed. This resultant material has such a low reactivity with the developer that it frequently remains in the form of scum without being removed in the developing process. Since an underlying layer is generally formed of silicon nitride in such pad opening processes, the problem of scum takes place more frequently.

Hereinafter, a lithography process will be explained including a related art method of patterning a photoresist film, with reference to FIG. 2 illustrating a flow chart of a related art lithography process.

First, after a surface treatment is carried out in order to reinforce an adhesive strength of a photoresist, a photoresist film is coated (S100). In order to reinforce an adhesive strength, the material which makes the surface of a substrate hydrophobic so as to improve resistance against water, for example HMDS (Hexa Methyldisilazane), is put in a tank with nitrogen gas and coated on the substrate in vapor.

Next, a soft bake process and an exposure process are carried out, after a mask is aligned on the substrate (S101). A soft bake process is used to remove a photoresist solution and set up on temperature condition for components of photoresist not to be pyrolyzed.

Next, PEB and development processes are carried out (S102). The PEB is carried out to improve uniformity of critical dimension within the substrate by preventing a standing wave phenomenon. At this moment, scum, photoresist residue and so on take place after a development process.

Finally, the photoresist film is removed after a desired pattern is obtained by etching the underlying layer (S103). The problems such as scum, photoresist residues, and so on, disturb the etching of the underlying layer, thus forming a bridge between wiring lines which causes a short failure of a device.

To resolve the above described problem, Korean patent laid-open publication No. 2003-0056342 describes a method for forming a pattern in semiconductor device, including steps of forming thin film to be desired to form into a pattern, carrying out a surface treatment at the thin film using $O_2$ plasma, and forming a photoresist pattern on the thin film which the plasma process is carried out. However, such a method has limitations in properties of a thin film, and problems that it is impossible to remove scum occurring even after a plasma process.

SUMMARY OF THE INVENTION

It is, therefore, an object of the present invention to resolve the above described problems, is to provide a method for patterning a photoresist film using a lithographic process which can improve accuracy of pattern formation.

Another object of the present invention is to provide a method for patterning a photoresist film using a lithographic process which can prevent problems such as scum.

Accordingly, the present invention advantageously provides a method for patterning a photoresist film in a lithographic pocess including the steps of coating the photoresist film on a substrate provided with an under layer, exposing the substrate, firstly developing the photoresist film, exposing a whole surface of the substrate, and secondly developing the photoresist film.

These and other aspects will become evident by reference to the description of the invention.

BRIEF DESCRIPTION OF DRAWINGS

A more complete appreciation of the invention and many of the attendant advantages thereof will become readily apparent with reference to the following detailed description, particularly when considered in conjunction with the accompanying drawings, in which.

DETAILED DESCRIPTION OF THE INVENTION

Figure 1:
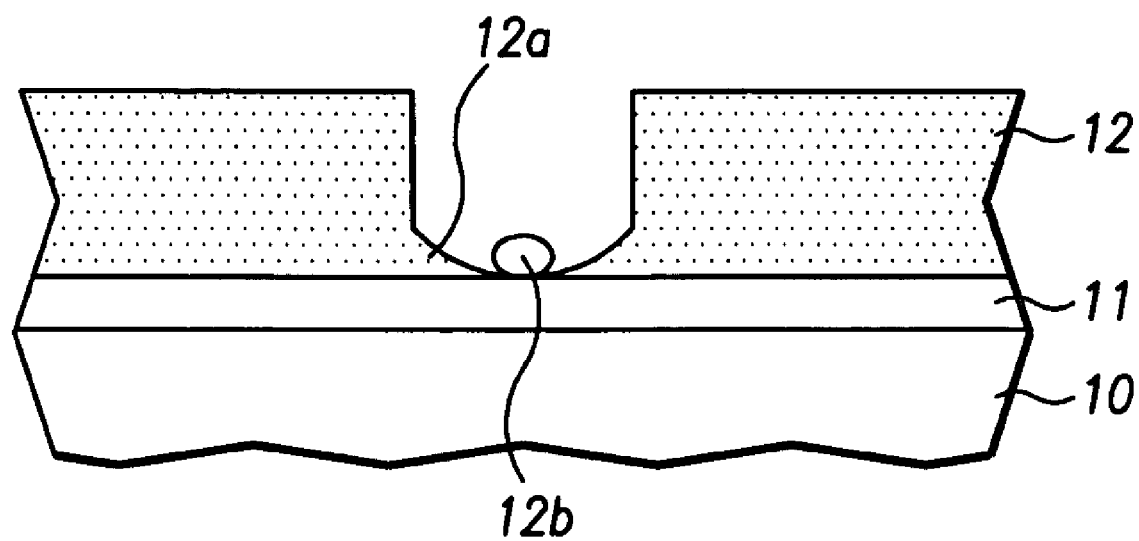
FIG. 1 is a cross-sectional view illustrating scum and photoresist residues after developing a photoresist film.
Figure 2:
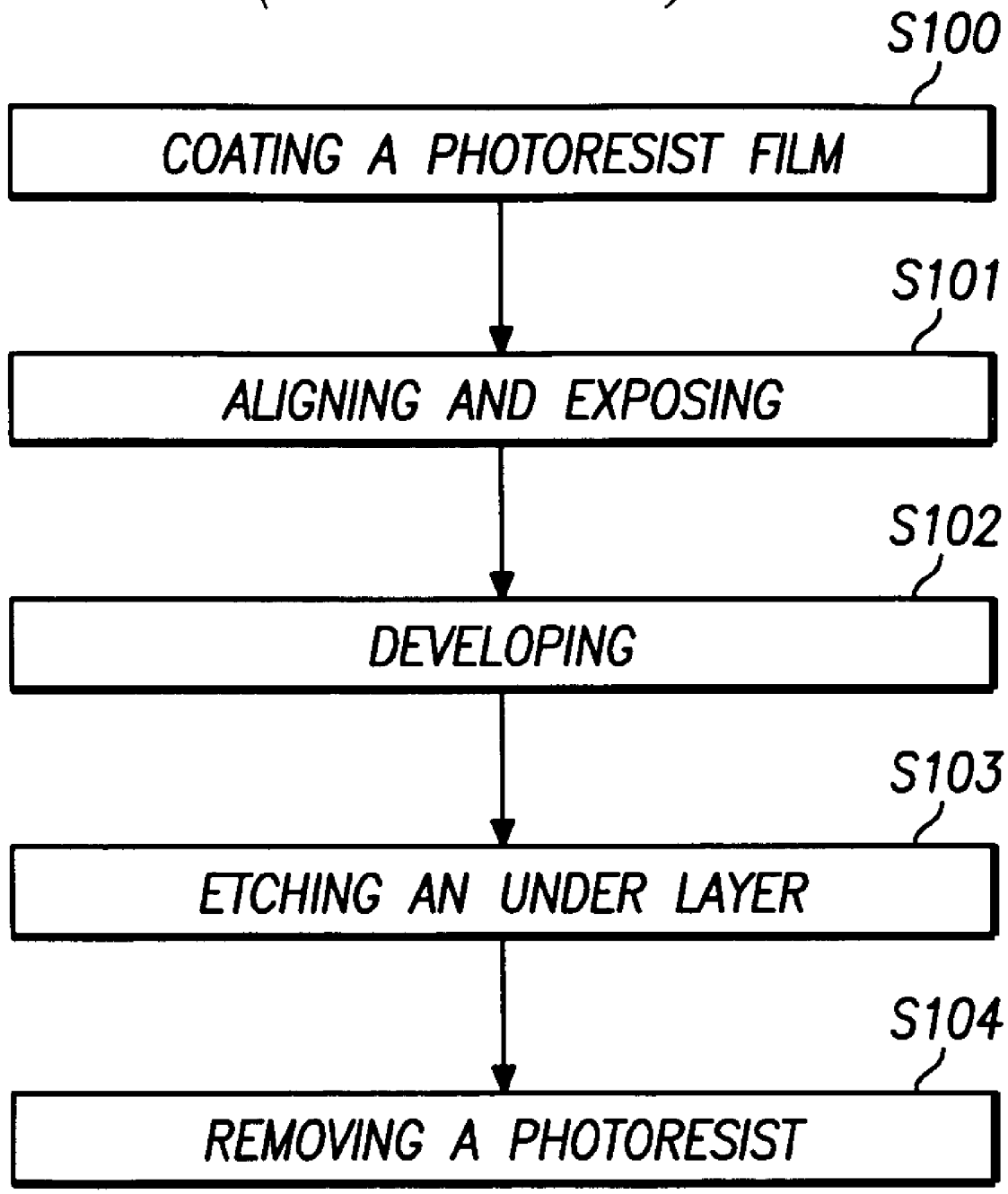
FIG. 2 is a flow chart of a related art lithographic process.
Figure 3:
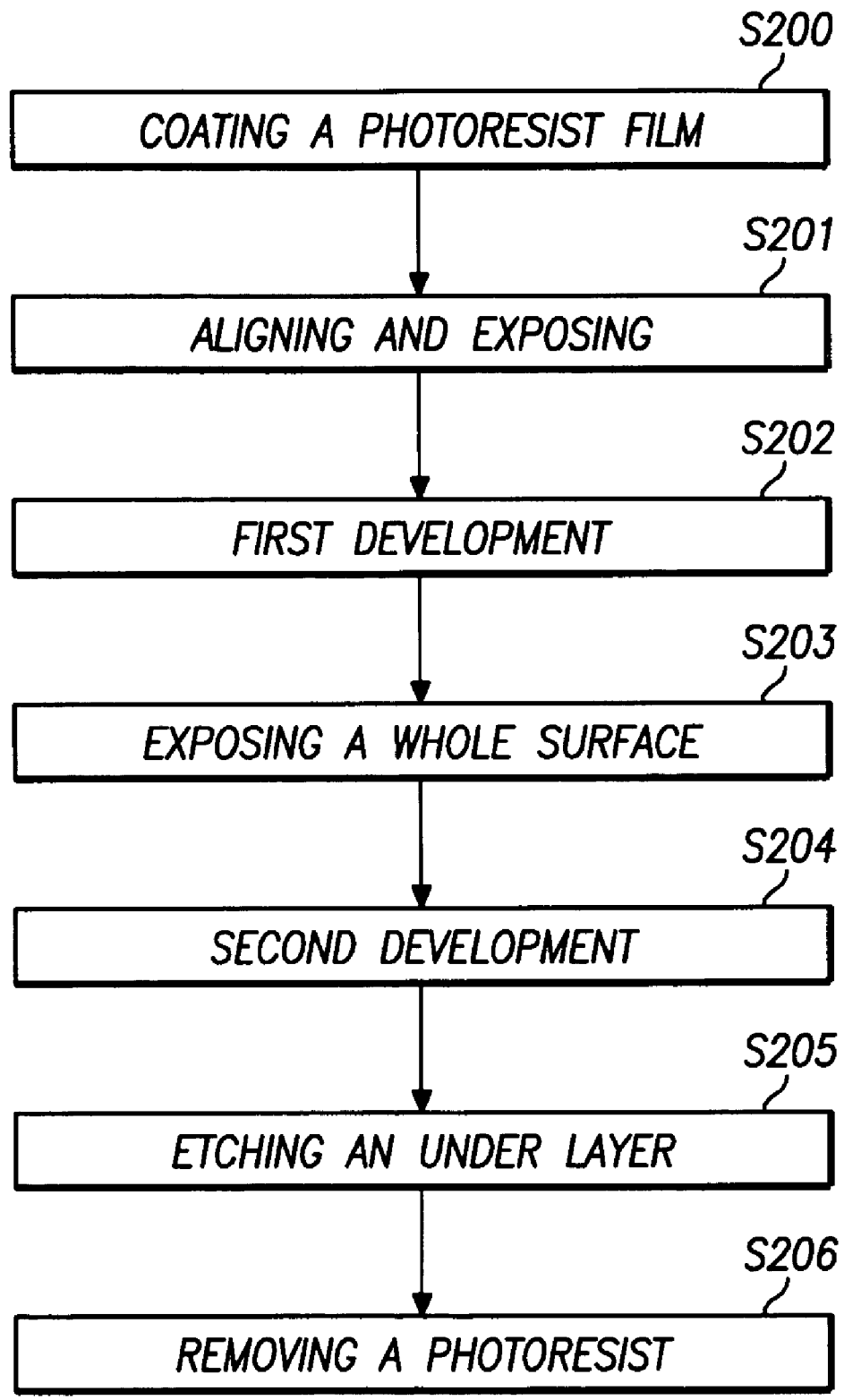
FIG. 3 is a flow chart of a lithographic process according to the present invention.

FIG. 3 is a flow chart of a lithographic process including a process for forming a photoresist film according to the present invention.

First, a photoresist film is coated after carrying out a surface modification on an underlying layer of the substrate (S200). The surface modification is to reinforce an adhesive strength of a photoresist. The underlying layer is not limited in material properties. Furthermore, problems such as scum may be primarily removed by an $O_2$ plasma process on the underlying layer before coating the photoresist film. Especially, in case the under layer is silicon oxynitride or silicon nitride, the effects of surface modification resulting from the $O_2$ plasma process is consipicuous. Generally, in pad opening processes, many problems such as scum occur because a silicon nitride film exists on metal film for pad. In this case, occurrence of scum is primarily removed by carrying out the $O_2$ plasma process.

Such an $O_2$ plasma process is used to substitute bonding of Si—O for bonding of Si—N on the surface of the underlying layer so as to modify the surface to be hydrophilic. By preventing a reaction between a photoresist film and the underlying layer after coating the photoresist film, occurrence of problems such as scum can be prevented.

Next, a mask is aligned on the substrate, and an exposure process is carried out (S201). Before the process of the alignment of the mask and exposure, a soft bake process is carried out. The soft bake process is used to remove a photoresist solution, and set up on temperature condition for photoresist components not to be pyrolyzed. After such a soft bake process, a sequence of processes of alignment and exposure are carried out. The sequence of processes includes the steps of reading a position of an align mark on a substrate using an alignment sensor, evaluating a position error by comparing the position of the align mark and a position of the align mark set on a job file, evaluating translation data, rotation data, and expansion data of the substrate on the basis of the position error, evaluating an exposing location of a present layer on the basis of the evaluated data, and exposing the substrate.

As a mask available for the present invention, there are reflective masks, phase shift masks, as well as common masks wherein chrome/chrome oxide is deposited on quartz substrate. As a light source, there are, for example, excimer lasers such as a KrF laser having a 248 nm of wavelength, a ArF laser having a 193 nm of wavelength within DUV (Deep Ultraviolet) region, as well as g-line of 436 nm, i-line of 365 nm, h-line of 405 nm and broad band (240~440 nm) arising from a mercury lamp, xenon (Xe) lamp, and the like.

Next, a first development process is carried out on the photoresist film (S202). Before the first development process, PEB is preferably carried out to improve a uniformity of a critical dimension within a substrate. Preferably, the first development of the photoresist film is carried out by a wet development using alkaline aqueous solution containing TMAH as a main component. Even though problems such as scum, photoresist residues, and so on, can be removed considerably by means of carrying out an $O_2$ plasma process at an underlying layer, problems such as scum, photoresist residues, and so on may still remain. Therefore, the problems will be removed completely through a whole surface exposure and a second development, to be described hereinafter.

Next, a whole surface exposure is carried out (S203). A light source in the whole surface exposure is the same as that in the exposure process of S201. The light source is used at low exposure energy to the extent of selectively removing only scum, and/or photoresist residues. The exposure of low exposure energy does not affect photoresist patterns so that it is not necessary for aligning a mask and a substrate. That is, it is set on an exposure energy at which it is not necessary for a sequence of an exposure process including alignment of a substrate, as carried out in the exposure process (S201).

Figure 4:
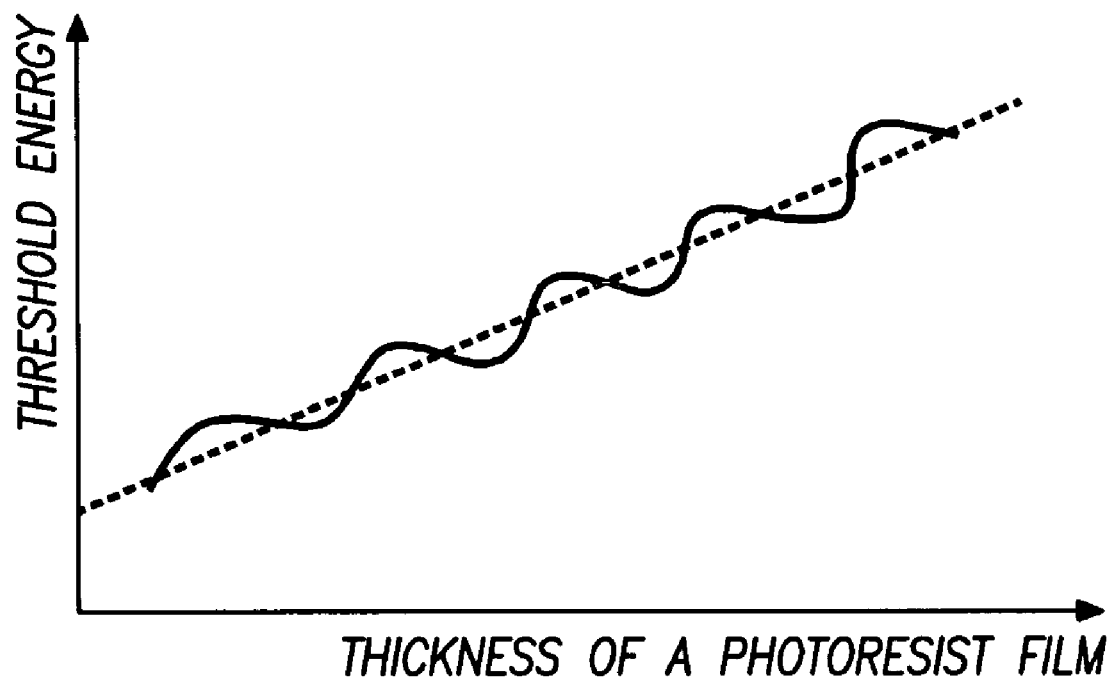
FIG. 4 is a diagram illustrating a relationship between a thickness of photoresist film and threshold energy.
Figure 5:
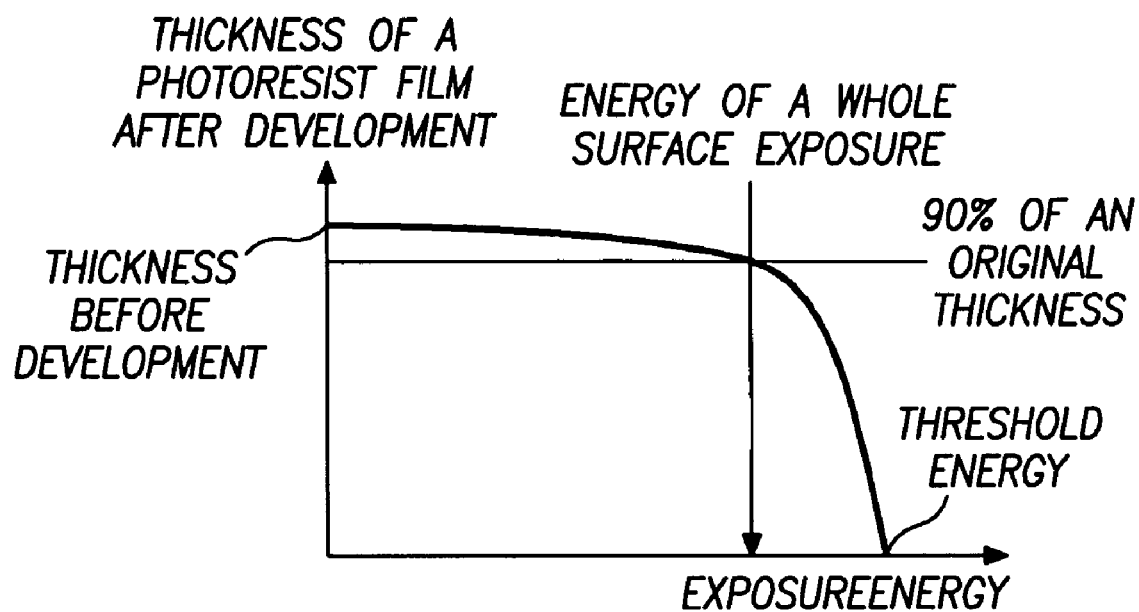
FIG. 5 is a diagram illustrating a relationship between exposure energy and a thickness of photoresist film after a development process.

As shown in FIG. 4, there is a threshold energy which has the minimum of exposure energy necessary for removing a photoresist film during development. Generally, the thicker the photoresist film, then the higher the value of the threshold energy. Therefore, there is an exposure energy at which only scum and/or photoresist residues are selectively removed without affecting photoresist patterns. As shown in FIG. 5, the whole surface exposure is preferably carried out at the exposure energy which can reduce the thickness of a photoresist film to the extent of 5~20% of an initial thickness of the photoresist film. More preferably, the exposure energy can reduce the thickness of a photoresist film to the extent of not more that about 10% of an initial thickness. Thus, it is possible to selectively remove only scum and/or photoresist residues.

By carrying out the whole surface exposure, problems such as scum, and photoresist residues can be prevented and the accuracy of formation of pattern can be improved, without additional cost and delay of process time. However, if such exposure processes do not cause a bottle neck problem in whole process time, it is possible to form more accurate patterns through alignment and exposure processes using a mask for patterning the photoresist film.

In order to remove scum or photoresist residues, the photoresist is preferably a positive photoresist. As a positive photoresist, there are a nobolac-type resist, a chemically amplified resist, a chain-scission-type resist, and so on.

Next, a second development is carried out in order to remove scum and photoresist residues (S204). Preferably, a developer in the second development is the same as that in the first development.

Finally, the underlying layer is etched (S205) and the photoresist film is removed (S206). In a pad opening process, the underlying layer is etched so that a metal pad is revealed.

The method of patterning a photoresist film in lithographic process according to the present invention, has the effect of improving accuracy of formation of pattern and preventing from scum, photoresist residues, and so on, with relatively low cost and short process time.

Korean Patent Application No. 2004-35850, filed on May 20, 2004, is hereby incorporated by reference in its entirety.

While the invention has been shown and described with reference to certain preferred embodiments thereof, it will be understood by those skilled in the art that various changes in form and details may be made therein without departing from the spirit and scope of the invention as defined by the appended claims.

What is claimed is:

1. A method for patterning a photoresist film using lithography, comprising:
    coating the photoresist film on a substrate provided with an under layer;
    exposing the substrate to light through a lithographic photomask;
    a first developing of the photoresist film;
    exposing a whole surface of the substrate to light; and
    a second developing of the photoresist film;
    wherein exposing a whole surface of the substrate comprises exposing the whole surface of the substrate to a light source with an exposure energy operable to reduce a thickness of the photoresist film by about 10% of an initial thickness of the photoresist film after the second developing.

2. The method of claim 1, further comprising the step of performing an O2 plasma process on the under layer, before the step of coating the photoresist film.

3. The method of claim 1, wherein the under layer is silicon oxynitride or silicon nitride.

4. The method of claim 1, wherein a light source in the step of exposing a whole surface of the substrate is the same as that in the step of exposing the substrate.

5. A method for patterning a photoresist film using lithography, comprising:
    a step for coating the photoresist film on a substrate provided with an under layer;
    a step for exposing the photoresist film to light having a first exposure energy via a lithographic photomask;
    a step for firstly developing the photoresist film;
    a step for exposing a whole surface of the photoresist film having a second exposure energy lower than the first exposure energy; and
    a step for secondly developing the photoresist film;
    wherein the step for exposing a whole surface of the photoresist film comprises exposing the whole surface of the photoresist film to light with the second exposure energy so as to reduce a thickness of the photoresist film by about 10% of an initial thickness of the photoresist film after the second developing.

6. The method of claim 5, further comprising a step for performing an O2 plasma process on the under layer, before the step for coating the photoresist film.

7. The method of claim 5, wherein the under layer is silicon oxynitride or silicon nitride.

8. The method of claim 5, wherein a light source in the step for exposing a whole surface of the substrate is the same as that in the step for exposing the substrate.

* * * * *